(12) United States Patent
Pyeoun (10) Patent No.: US 9,313,431 B2
(45) Date of Patent: Apr. 12, 2016

(54) IMAGE SENSOR

(71) Applicant: SK hynix Inc., Gyeonggi-do (KR)

(72) Inventor: Chang-Hee Pyeoun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/497,059

(22) Filed: Sep. 25, 2014

(65) Prior Publication Data

US 2016/0021320 A1    Jan. 21, 2016

(30) Foreign Application Priority Data

Jul. 21, 2014    (KR) ........................ 10-2014-0091837

(51) Int. Cl.
| | |
|---|---|
| *G02B 7/28* | (2006.01) |
| *G02B 7/34* | (2006.01) |
| *H04N 5/369* | (2011.01) |
| *H04N 9/04* | (2006.01) |

(52) U.S. Cl.
CPC ............... *H04N 5/369* (2013.01); *H04N 9/045* (2013.01)

(58) Field of Classification Search
CPC ....... G02B 7/28; G02B 7/34; H04N 2209/045
See application file for complete search history.

(56) References Cited

U.S. PATENT DOCUMENTS

| | | | | |
|---|---|---|---|---|
| 7,928,352 B2 * | 4/2011 | Toda | ................. | H01L 27/14603 250/208.1 |
| 8,319,882 B2 | 11/2012 | Fujii et al. | | |
| 8,638,381 B2 * | 1/2014 | Murata | ................ | G02B 3/0056 348/272 |
| 8,704,942 B2 | 4/2014 | Shimoda et al. | | |

\* cited by examiner

*Primary Examiner* — Tuan Ho (74) *Attorney, Agent, or Firm* — IP & T Group LLP

(57) ABSTRACT

An image sensor includes: a plurality of pixels arranged in two dimensions, wherein at least one pixel among the pixels includes: a photoelectric conversion layer formed in a substrate; a color filter layer formed over the photoelectric conversion layer; a first shading layer formed in the same plane as the color filter layer and defining a first light transmitting region; and a second shading layer formed between the photoelectric conversion layer and the first shading layer and defining a second light transmitting region.

18 Claims, 5 Drawing Sheets

IMAGE SENSOR

CROSS-REFERENCE TO RELATED APPLICATIONS

The present application claims priority of Korean Patent Application No. 10-2014-0091837, filed on Jul. 21, 2014, which is incorporated herein by reference in its entirety.

BACKGROUND

1. Field

Exemplary embodiments of the present invention relate to semiconductor device fabrication technology and, more particularly, to an image sensor including a phase-difference detection pixel.

2. Description of the Related Art

Most imaging devices, such as digital cameras and camcorders, adopt auto-focus systems. Auto-focus systems are divided into those that use a phase difference detecting scheme and those that use a contrast detecting scheme.

Phase difference auto-focus systems have a sensor for detecting phase differences in addition to an image sensor. Auto-focusing is accomplished by adjusting the lens based on an output of the phase difference detecting sensor. The phase difference detecting scheme also requires a mirror. For example, in an auto-focusing scheme for a Digital Single Lens Reflection (DSLR) camera, a sub-mirror for guiding incident light into a phase difference detecting sensor is provided in addition to a main mirror. The phase difference-based auto-focusing is advantageous in that it makes fast and high-performance auto-focusing possible. However, the phase difference-based auto-focusing is a high-cost system since it requires a sensor dedicated to the phase difference-based auto-focusing and an optical system.

In comparison, contrast detecting auto-focus systems rely on high-frequency data. This method of auto-focusing is referred to as contrast auto-focusing. Since contrast auto-focusing does not require a signal processing circuit or a phase detecting sensor, which are essential in the phase difference-based auto-focusing, contrast auto-focusing has a relatively low cost. However, contrast auto-focusing is slower and less accurate than phase difference-based auto-focusing.

SUMMARY

An embodiment is directed to an image sensor including a phase difference detecting pixel with improved performance.

In accordance with an embodiment of the present invention, an image sensor includes: a plurality of pixels arranged in two dimensions, wherein at least one pixel among the pixels includes: a photoelectric conversion layer formed in a substrate; a color filter layer formed over the photoelectric conversion layer; a first shading layer formed in the same plane as the color filter layer and defining a first light transmitting region; and a second shading layer formed between the photoelectric conversion layer and the first shading layer and defining a second light transmitting region.

The first shading layer may include a color filter material. The first shading layer may include a black filter or an infrared ray cutoff filter. The first shading layer may include a stacked structure having two or more filters selected from a red filter, a green filter, a blue filter, a cyan filter, a magenta filter, and a yellow filter.

The first light transmitting region may correspond to the color filter layer. The color filter layer may include one selected from a white filter, a red filter, a green filter, a blue filter, a cyan filter, a magenta filter, and a yellow filter.

The first light transmitting region and the second light transmitting region may be disposed in different directions from each other relative to a center of the photoelectric conversion layer.

An end of the first light transmitting region and an end of the second light transmitting region may be aligned at the center of the photoelectric conversion layer. A portion of the first light transmitting region may overlap with a portion of the second light transmitting region to share the center of the photoelectric conversion layer. The first light transmitting region and the second light transmitting region may be spaced apart from each other relative to the center of the photoelectric conversion layer.

In accordance with another embodiment of the present invention, an image sensor includes: a plurality of pixels arranged in two dimensions, wherein the pixels include at least a pair of phase difference detecting pixels that perform a pupil division on an object light in a first direction and a second direction that are different from each other and output pupil-divided images, and each of the pair of the phase difference detecting pixels includes: a photoelectric conversion layer formed in a substrate; a color filter layer formed over the photoelectric conversion layer; a first shading layer formed in the same plane as the color filter layer and defining a first light transmitting region; and a second shading layer formed between the photoelectric conversion layer and the first shading layer and defining a second light transmitting region, and the pair of the phase difference detecting pixels includes: a first phase difference detecting pixel that has the first light transmitting region of the first shading layer disposed toward the first direction and has the second light transmitting region of the second shading layer disposed toward the second direction; and a second phase difference detecting pixel that has the first light transmitting region of the first shading layer disposed toward the second direction and has the second light transmitting region of the second shading layer disposed toward the first direction.

The image sensor may further include: an inter-layer dielectric layer interposed between the substrate, on one side, and the color filter layer and the first shading layer, on an opposite side, and including the second shading layer; and a micro lens formed over the color filter layer and the first shading layer, to correspond to each pixel.

The first shading layer may include a color filter material. The first shading layer may include a black filter or an infrared ray cutoff filter. The first shading layer may include a stacked structure having two or more filters selected from a red filter, a green filter, a blue filter, a cyan filter, a magenta filter, and a yellow filter.

The first light transmitting region may correspond to the color filter layer. The color filter layer may include one selected from a white filter, a red filter, a green filter, a blue filter, a cyan filter, a magenta filter, and a yellow filter. The first light transmitting regions of the pair of the phase difference detecting pixels may be disposed away from each other, and the second light transmitting regions of the pair of the phase difference detecting pixels may be disposed facing each other.

DETAILED DESCRIPTION

Exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments.

The drawings are not necessarily to scale and, in some instances, proportions may be exaggerated to clearly illustrate features of the embodiments. When a first layer is referred to as being "on" a second layer or "on" a substrate, it not only refers to the first layer being formed directly on the second layer or the substrate but also to when a third layer exists between the first layer and the second layer or the substrate.

The following embodiments are directed to an image sensor mounted on an auto-focus system. More specifically, the following embodiments describe an image sensor mounted on an auto-focus system with a phase-difference detecting scheme. The embodiments provide an image sensor including a phase difference detecting pixel with improved accuracy and an image sensor including phase difference detecting pixels capable of detecting phase differences in addition to image pixels for acquiring images. The phase difference detecting pixels may have a structure in which shading plates, having different light transmitting regions, are stacked in a vertical direction to improve accuracy. In the image sensor in accordance with the embodiments, which are to be described below, pixels arranged in two dimensions may be divided into image pixels and phase difference detecting pixels, or there may be only phase difference detecting pixels that also function as image pixels.

Before the image sensor in accordance with the embodiments is described, the principles of detecting phase differences in phase difference detecting pixels is described with reference to FIGS. 1 to 2.

Figure 1:
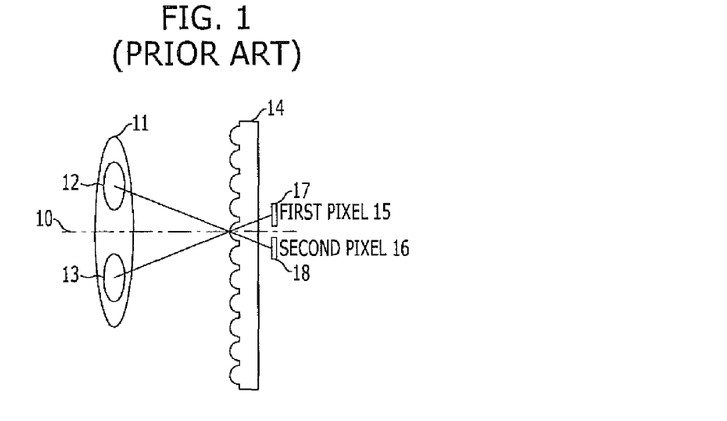
FIG. 1 illustrates detecting of phase differences using phase difference detecting pixels.

FIG. 1 illustrates detecting phase differences using a phase-difference detecting pixel. FIGS. 2A and 2B are graphs describing the phase difference of FIG. 1.

Referring to FIG. 1, a first pixel 15 and a second pixel 16 are required to detect phase differences by using phase difference detecting pixels. Incident light entering through an imaging lens 11 passes through a micro lens array 14 and is guided into the first pixel 15 and the second pixel 16 that include a photoelectric conversion layer, e.g., a photodiode. The first pixel 15 and the second pixel 16 include openings (or light transmitting regions) for restricting a pupil 12 and a pupil 13 from the imaging lens 11. The openings are defined by shading masks 17 and 18 that restrict the pupils 12 and 13 from the imaging lens 11. Incident light from the pupil 12 that is disposed over an optical axis 10 of the imaging lens 11 is guided into the second pixel 16, whereas incident light from the pupil 13 that is disposed under the optical axis 10 of the imaging lens 11 is guided into the first pixel 15. The first pixel 15 and the second pixel 16 receive incident light through the openings, which are defined by the shading masks 17 and 18, and the incident light is reversely projected by the micro lens array 14 to the pupils 12 and 13. This is called "pupil division".

Figure 2A:
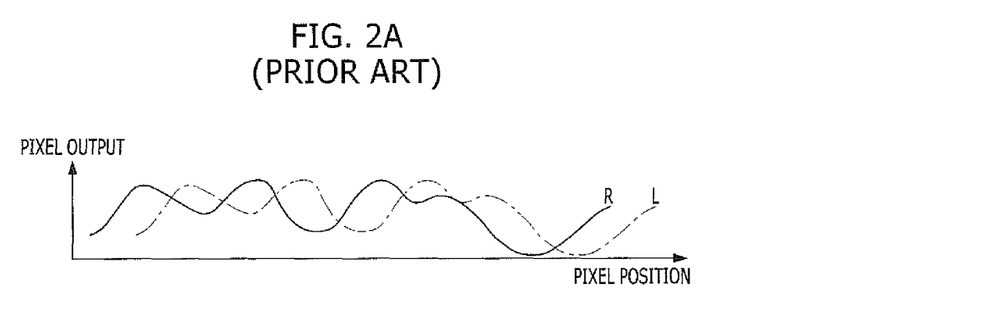
FIGS. 2A and 2B are graphs illustrating the phase difference of FIG. 1.
Figure 2B:
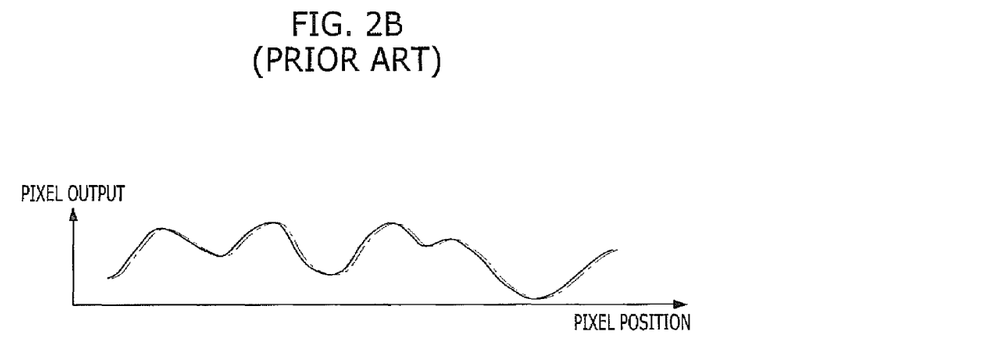

Continuous outputs of the first pixel 15 and the second pixel 16, which incorporate pupil division, are shown in FIGS. 2A and 2B. In the graphs of FIGS. 2A and 2B, the horizontal axis denotes the position of the first pixel 15 and the second pixel 16, while the vertical axis denotes output values of the first pixel 15 and the second pixel 16. Comparing the outputs of the first pixel 15 and the second pixel 16, it may be seen that the output graphs are the same, but merely shifted. This shift in phase is present due to light, coming from the eccentrically formed pupils 12 and 13 of the imaging lens 11 forming images in different locations. As illustrated in 2A, when focus points of light from the eccentrically formed pupils 12 and 13 are inconsistent with each other, the first pixel 15 and the second pixel 16 exhibit output phase differences. As illustrated in FIG. 2B when the focus points of light from the eccentrically formed pupils 12 and 13 are consistent with each other, images are formed at the same position. Additionally, the direction of focus may be determined from the phase difference. "Front-focusing" indicates that an object is in a front focus state. In front-focusing, the phase of the output of the first pixel 15 is shifted further to the left compared to when the image is in focus, and the phase of the output of the second pixel 16 is shifted further to the right compared to when the image is in focus, In contrast, "back-focusing" indicates that an object is in a back focus state. In back-focusing, the phase of the output of the first pixel 15 is shifted further to the right compared to when the image is in focus and the phase of the output of the second pixel 16 is shifted further to the left compared to when the image is in focus. The shift amount between the phases of the first pixel 15 and the second pixel 16 may be converted to a deviation amount between the points of focus.

The phase difference detecting pixels of the image sensor are formed to include the shading masks 17 and 18 having openings eccentrically disposed in a predetermined direction between the micro lens and the photoelectric conversion layer. The shading masks 17 and 18 allow incident light entering from a predetermined direction to pass through into the photoelectric conversion layer. Since the first pixel 15 and the second pixel 16 respectively include shading masks 17 and 18 and their openings, not only may incident light entering from the intended direction pass through the opening, but incident light entering from an opposite direction may also pass through the openings and into the photoelectric conversion layer. This results in deterioration of the accuracy of the phase difference detecting pixels.

The shading masks 17 and 18 may be formed using metal line-type structures composed of metal material. The characteristics of the phase difference-based auto-focusing may be improved by putting the imaging lens and the micro lens as close as possible to the shading masks 17 and 18. However, since the shading masks 17 and 18 are formed using line structures, the ability to move these elements closer together is limited since they have to be located between the color filter layer and the photoelectric conversion layer.

The following embodiments provide an image sensor including a phase difference detecting pixel with improved accuracy. Hereafter, the phase difference detecting pixel in accordance with an embodiment of the present invention and the principles of auto-focusing using the phase difference detecting pixel are described in detail.

Figure 3:
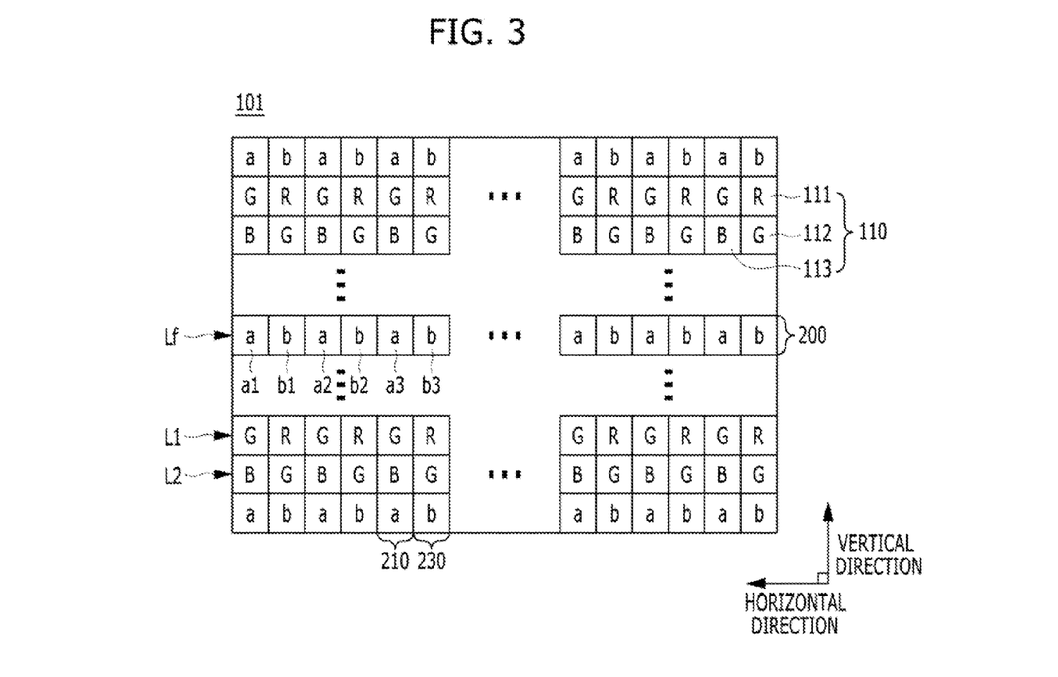
FIG. 3 is a plan view illustrating a pixel array of an image sensor in accordance with an embodiment of the present invention.
Figure 4:
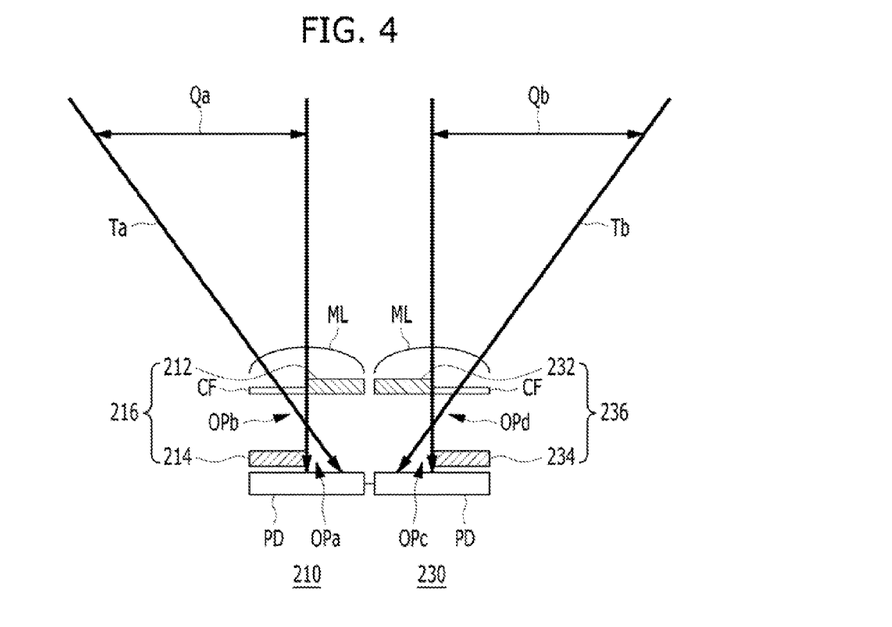
FIG. 4 is a schematic view illustrating a phase difference detecting pixel in accordance with an embodiment of the present invention.

FIG. 3 is a plan view illustrating a pixel array of an image sensor in accordance with an embodiment of the present invention, and FIG. 4 is a schematic view illustrating a phase difference detecting pixel in accordance with the embodiment of the present invention. FIG. 4 shows a phase difference detecting pixel positioned at the center of the pixel array shown in FIG. 3.

Referring to FIGS. 3 and 4, the image sensor in accordance with the embodiment of the present invention includes a pixel array 101 having a plurality of pixels arranged in a two-dimensional matrix. The pixel array 101 includes a plurality of image pixels 110 and a plurality of phase difference detecting pixels 200. The phase difference detecting pixels 200 may be formed in units that include a pair of pixels 210 and 230 for detecting a phase difference.

The image pixels 110 may include red pixels 111, green pixels 112, and blue pixels 113 in which a red filter R, a green filter L, and a blue filter B are disposed, respectively. The image pixels 110 may include a first line L1 where green pixels 112 and red pixels 111 are alternately disposed in a horizontal direction and a second line L2 where blue pixels 113 and green pixels 112 are alternately disposed in the horizontal direction. Since the first and second lines L1 and L2 alternate in a vertical direction, a Bayer arrangement may be formed.

According to a modified example of the present embodiment, either the green pixels 112 of the first line L1 or the green pixels 112 of the second line L2 may be replaced by white pixels having a white filter, or both the green pixels 112 of the first line L1 and the green pixels 112 of the second line L2 may be replaced by white pixels. According to another modified example of the present embodiment, the image pixels 110 may include cyan pixels, magenta pixels, and yellow pixels, which include a cyan filter, a magenta filter, and a yellow filter, respectively.

The phase difference detecting pixels 200 in accordance with an embodiment of the present invention include a pair of pixels 210 and 230 having two shading layers 212 and 214 and shading layers 232 and 234, respectively, and openings OPa and OPb for isolating a light beam Ta from Qa that corresponds to a left pupil of the imaging lens and openings OPc and OPd for isolating a light beam Tb from Qb that corresponds to a right pupil of the imaging lens. An auto-focusing line Lf is formed, as more than two of the phase difference detecting pixels 200 are arranged in the horizontal direction.

The first pixel 210 includes an opening OPa of a rectangular form or a slit form, positioned to the right relative to the photoelectric conversion layer PD, which is defined by the second shading layer 214 in the lower part of the first pixel 210. Additionally, an opening OPb of a slit form, positioned to the left relative to the photoelectric conversion layer PD, is defined by the first shading layer 212 in the upper part of the first pixel 210. The openings OPa and OPb are the light transmitting regions of the first shading portion 216 that includes the first shading layer 212 and the second shading layer 214. The light transmitting region defines Qa, which is the range of angles from which light may pass to the photo conversion layer PD, and corresponds to the left pupil in the imaging lens.

The second pixel 230 includes an opening OPc in slit form, positioned to the left relative to the photoelectric conversion layer PD, which is defined by the second shading layer 234 in the lower part of the second pixel 230. Moreover, an opening OPd in slit form, positioned to the right relative to the photoelectric conversion layer PD, is defined by the first shading layer 232 in the upper part of the second pixel 230. The openings OPc and OPd define the light transmitting region of a second shading portion 236 that includes the first shading layer 232 and the second shading layer 234. The light transmitting region defines Qb, which is the range of angles from which light may pass to the photo conversion layer PD, and corresponds to the right pupil in the imaging lens.

The light beam Ta from the left pupil portion Qa passes through a micro lens ML, a color filter CF, and the openings OPa and OPb, that is, the light transmitting regions, of the second and first shading layers 214 and 212 and lands on the photoelectric conversion layer PD of the first pixel 210. The light beam Tb from the right pupil portion Qb passes through a micro lens ML, a color filter CF, and the openings OPc and OPd, that is, the light transmitting regions, of the second and first shading layers 234 and 232 and lands on the photoelectric conversion layer PD of the second pixel 230.

Hereafter, a phase difference detecting pixel in accordance with the embodiment of the present invention is described in detail with reference to FIGS. 5, 6A and 6B.

Figure 5:
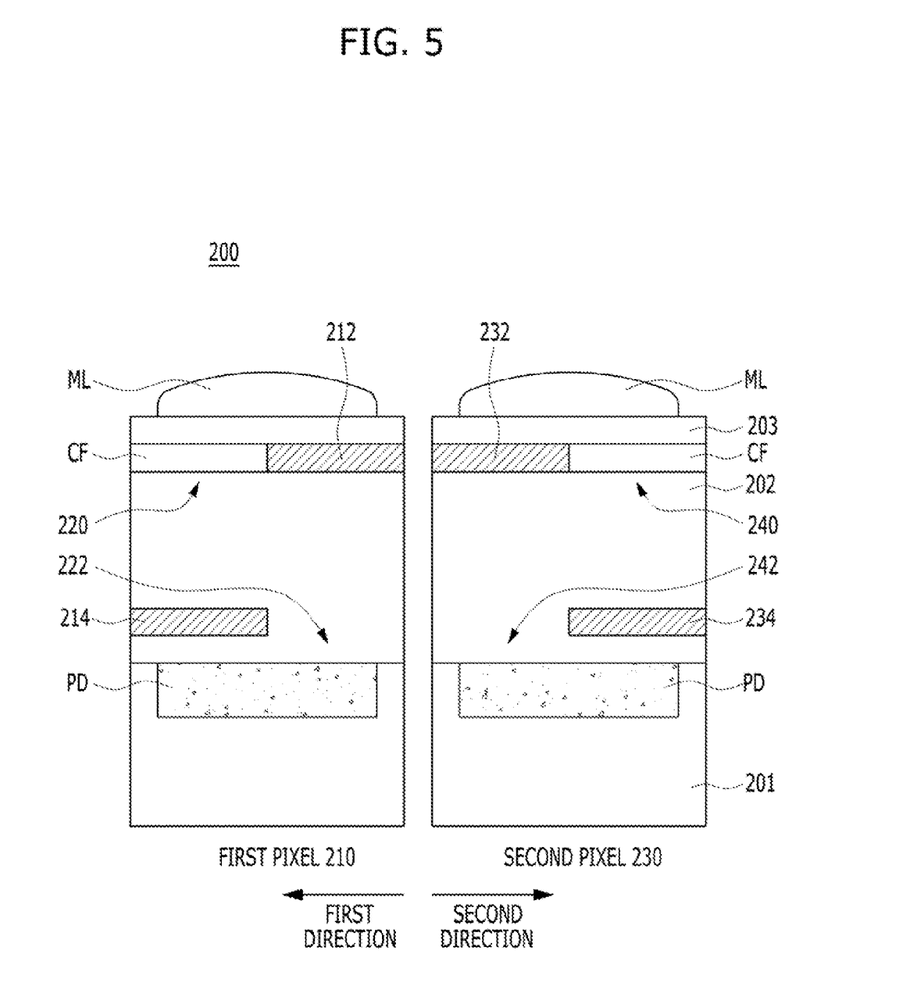
FIG. 5 is a cross-sectional view illustrating a phase difference detecting pixel in accordance with an embodiment of the present invention.

FIG. 5 is a cross-sectional view illustrating a phase difference detecting pixel in accordance with an embodiment of the present invention. FIG. 6A is a plan view illustrating the first shading layer in a phase difference detecting pixel in accordance with an embodiment of the present invention, and FIG. 6B is a plan view illustrating g the second shading layer in a phase difference detecting pixel in accordance with an embodiment of the present invention.

Figure 6A:
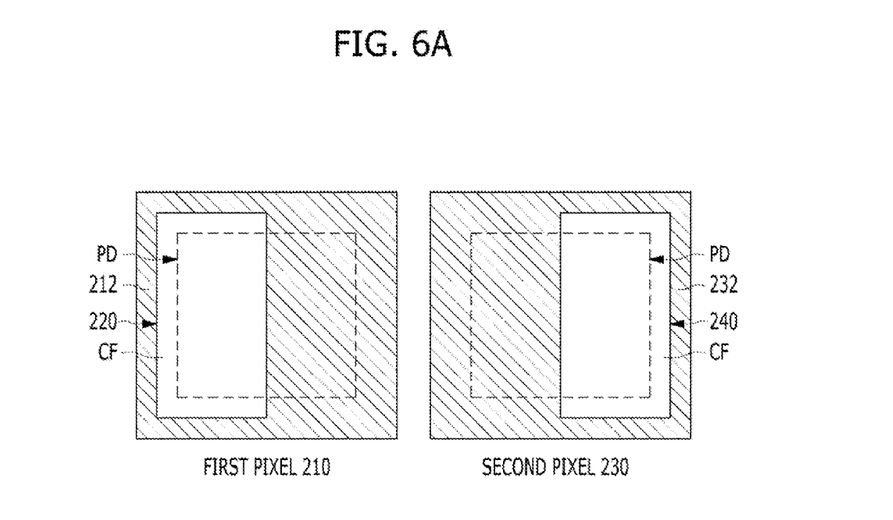
FIG. 6A is a plan view illustrating a first shading layer in a phase difference detecting pixel in accordance with an embodiment of the present invention.
Figure 6B:
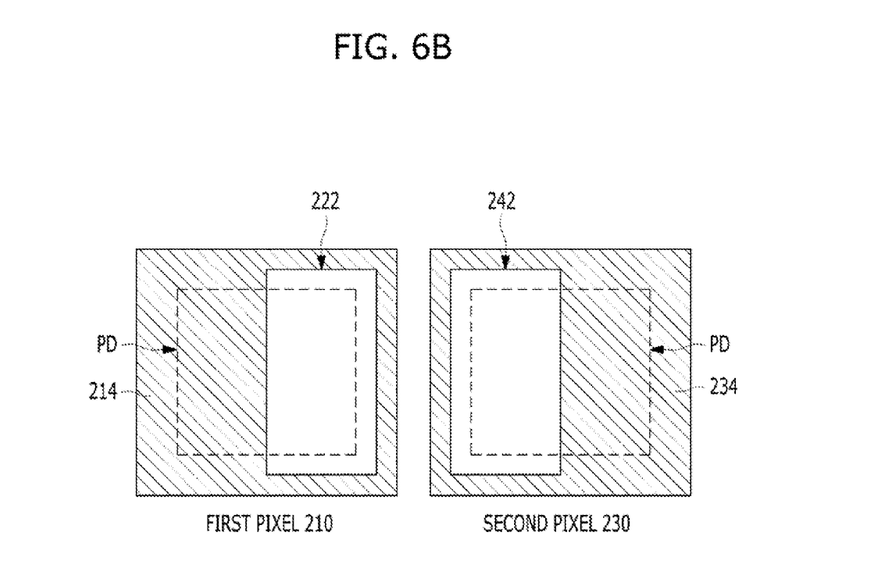
FIG. 6B is a plan view illustrating a second shading layer in a phase difference detecting pixel in accordance with an embodiment of the present invention.

Referring to FIGS. 5, 6A and 6B, the image sensor in accordance with the embodiment of the present invention may include a plurality of pixels that are arranged in two dimensions, and at least a pair of phase difference detecting pixels 200 that performs pupil division on incident light or object light in a first direction and a second direction, which are different from each other, to produce pupil-divided images, and output the pupil-divided images. The first direction and the second direction may be opposite to each other.

The pair of the phase difference detecting pixels 200 may include the first pixel 210 and the second pixel 230. Each of the first pixel 210 and the second pixel 230 may include a substrate 201, a photoelectric conversion layer PD formed in the substrate 201, an inter-layer dielectric layer 202 formed over the substrate 201, a color filter layer CF formed over the inter-layer dielectric layer 202, a first shading layer 212 or 232 formed in the same plane as the color filter layer CF and defining a first light transmitting region 220 or 240, a second shading layer 214 or 234 formed in the inter-layer dielectric layer 202 between the photoelectric conversion layer PD and the first shading layer 212 or 232, and a second light transmitting region 222 or 242. Furthermore, the pair of the phase difference detecting pixels 200 may further include a planarization layer 203 over the color filter layer CF and the first shading layer 212 or 232, and a micro lens ML for each of the first pixel 210 and the second pixel 230 over the planarization layer 203.

In the pair of phase difference detecting pixels 200, the first pixel 210 may have a first light transmitting region 220, defined by the first shading layer 212, disposed in a first direction and have a second light transmitting region 222, defined by the second shading layer 214, disposed in a second direction. The second pixel 230 may have a first light transmitting region 240, defined by the first shading layer 232, disposed in the second direction, and have a second light transmitting region 242, defined by the second shading layer 234, disposed in the first direction. Therefore, the first light transmitting regions 220 and 240 of the first shading layers 212 and 232 may be positioned opposite of each other while the second light transmitting regions 222 and 242 of the second shading layers 214 and 234 may face each other around the junction of the first and second pixels 210 and 230.

The substrate 201 may include a semiconductor substrate. The semiconductor substrate may be in a monocrystalline state, and it may include a silicon-containing material. That is, the substrate 201 may include a monocrystalline silicon-containing material.

The photoelectric conversion layer PD may include a plurality of photoelectric converters that overlap with each other vertically. Each of the photoelectric converters may be a photodiode including an N-type impurity region and a P-type impurity region.

In the phase difference detecting pixels 200, the color filter layer CF corresponds to the first light transmitting region 220 or 240 of the first shading layer 212 or 232. In short, the color filter layer CF may function as the first light transmitting region 220 or 240. In FIGS. 5 and 6A, the first light transmitting regions 220 and 240 of the first pixel 210 and the second pixel 230 may correspond to the openings OPb and OPd of FIG. 3.

The color filter layer CF may be selected from a red filter, a green filter, a blue filter, a cyan filter, a magenta filter, a yellow filter, and a white filter. Since the pair of phase difference detecting pixels 200 includes a first pixel 210 and a second pixel 230, the color filter layer CF may be a green filter or a white filter. When the color filter layer CF is a white filter, the amount of incident light may be increased, and as a result, image characteristics may be improved in low illumination environments.

The first shading layer 212 or 232 that is formed in the same plane as the color filter layer CF may include a color filter material. That is, the first shading layer 212 or 232 may be formed at the same time as the color filter layer CF. The first shading layer 212 or 232 may include a black filter or an infrared ray cutoff filter. Additionally, the first shading layer 212 or 232 may include a stacked structure having two or more filters selected from a red filter, a green filter, a blue filter, a cyan filter, a magenta filter, and a yellow filter. To effectively block incident light, the thickness of the first shading layer 212 or 232 may be the same or greater than that of the color filter layer CF.

The second shading layer 214 or 234 may be disposed in the vertical direction between the photoelectric conversion layer PD and the first shading layer 212 or 232. In FIGS. 5 and 6B, the first light transmitting regions 220 and 240 of the first pixel 210 and the second pixel 230 may correspond to the openings OPa and OPc shown in FIG. 3.

The second shading layer 214 or 234 may be disposed in the inter-layer dielectric layer 202 and include a plurality of lining structures (not shown). The second shading layer 214 or 234 may be formed using lining structures, and the second shading layer 214 or 234 may include a metallic material. The second light transmitting region 222 or 242, defined by the second shading layer 214 or 234, may have one of its ends aligned with one of the ends of first light transmitting region 220 or 240, and the two ends may meet directly above the center axis of the photoelectric conversion layer PD. Moreover, the second light transmitting region 222 or 242 may overlap with the first light transmitting region 220 or 240 and share the center axis of the photoelectric conversion layer PD. Additionally, the second light transmitting region 222 or 242 may be spaced apart from the first light transmitting region 220 or 240 by a predetermined distance, and surround the center axis of the photoelectric conversion layer PD. The positions of the first light transmitting regions 220 or 240 and the second light transmitting regions 222 or 242, whether overlapping, spaced apart, or abutting each other, may be determined based on the relative position of the phase difference detecting pixels 200 in the pixel array 101, as see in FIG. 3.

As the image sensor in accordance with the embodiment of the present invention has shading layers 212, 214, 232 and 234 and light transmitting regions 220, 222, 240 and 242 that are positioned in different horizontal directions and are stacked vertically the accuracy of the phase difference detecting pixels 200 may be improved. The second shading layer 214 or 234, disposed between the first shading layer 212 or 232 and the photoelectric conversion layer PD, may cut off incident light entering from directions that are not intended to be captured.

Since the first shading layer 212 or 232 is disposed in the same plane as the color filter layer CF, the distance between the imaging lens or the micro lens ML and the shading mask may be shortened. This allows the characteristics of the phase difference-based auto-focusing to be improved.

Since the first shading layer 212 or 232 is disposed in the same plane as the color filter layer CF, low illumination environment characteristics may be improved by the shortened vertical distance between the first shading layer 212 or 232 and the second shading layer 214 or 234. This increases the amount of incident light compared with structures in which the first shading layer 212 or 232 and the second shading layer 214 or 234 are formed as line structures.

In addition, since the first shading layer 212 or 232 is formed of a color filter material, manufacturing productivity of the image sensor may be improved.

Hereafter, the pixel output of an auto-focusing line Lf is described with reference to FIGS. 3 to 8. The pixel output of the first pixel 210 is referred to as "a first output", and the pixel output of the second pixel 230 is referred to as "a second output". The relationship between the pixel output of the first pixel-based pixel row (see reference numerals a1, a2 and a3 of FIG. 3) and the pixel output of the second pixel-based pixel row (see reference numerals b1, b2 and b3 of FIG. 3) that are obtained from the phase difference detecting pixels 200 in the auto-focusing line Lf of FIG. 3, will be described.

Figure 7:
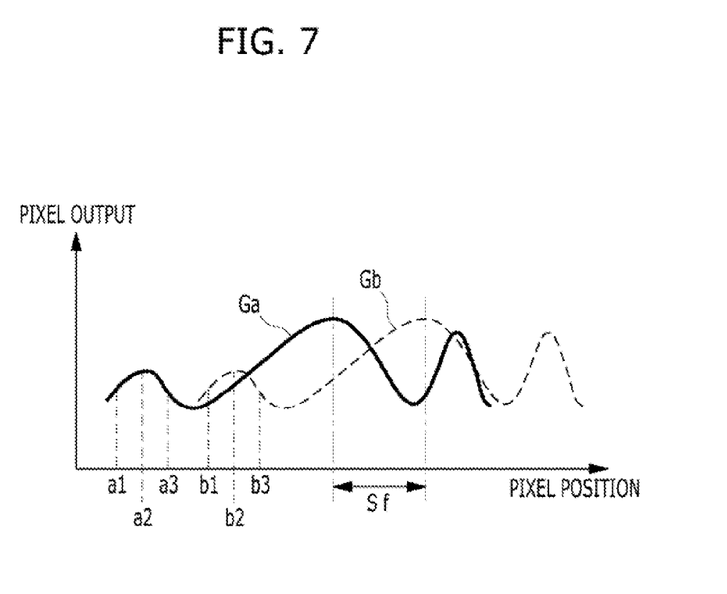
FIG. 7 is a graph showing a pixel output of an auto-focusing line in an image sensor in accordance with an embodiment of the present invention.
Figure 8:
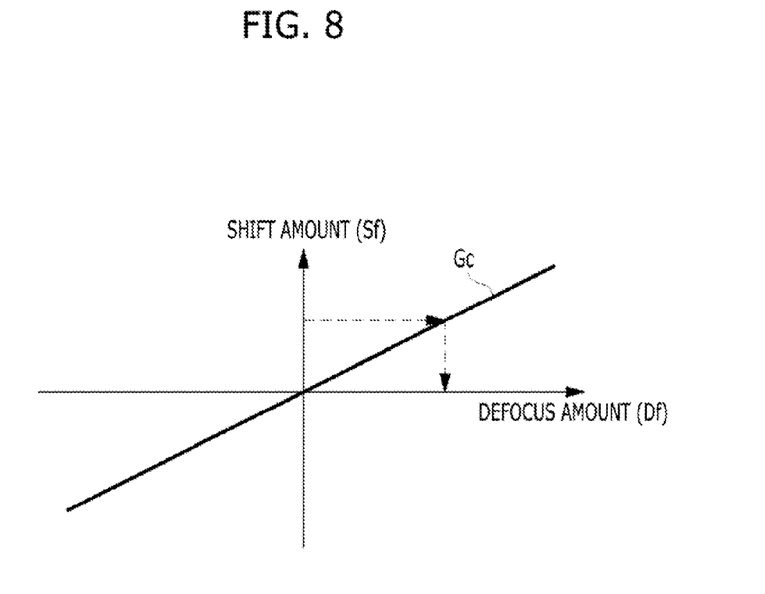
FIG. 8 is a graph showing a shift amount Sf and a defocus amount Df of the pixel output in the image sensor in accordance with an embodiment of the present invention.

FIG. 7 is a graph showing the pixel output of an auto-focusing line in an image sensor in accordance with an embodiment of the present invention. FIG. 8 is a graph showing a shift amount Sf and a defocus amount Df of the pixel output in an image sensor in accordance with an embodiment of the present invention.

Referring to FIGS. 3 to 8, light beams Ta and Tb from both pupils are received in the first pixel 210 and the second pixel 230 of the auto-focusing line Lf. The pixel output of the first pixel-based pixel row, in the auto-focusing line Lf including pixels a1 to a3, is represented by a solid line graph Ga in FIG. 7. The pixel output of the second pixel-based pixel row, in the auto-focusing line Lf including pixels b1 to b3, is represented by a dotted line graph Gb in FIG. 7.

Comparing the line Ga and the line Gb in the graph of FIG. 7, the pixel output of the first pixel-based pixel row and the pixel output of the second pixel-based pixel row have a phase difference corresponding to the shift amount Sf in the direction of the auto-focusing line Lf. The direction of the auto-focusing line Lf is the horizontal direction in which the phase difference detecting pixels 200 are alternately arranged.

The relationship between the shift amount Sf and the defocus amount Df may be represented by the line Gc of FIG. 8, which is a linear function. The gradient of the graph Gc may be obtained from factory testing.

Therefore, the image sensor may obtain the shift amount Sf in a phase difference-based auto-focusing operation circuit based on the pixel output of the auto-focusing line Lf and then calculate the defocus amount Df based on the graph Gc of FIG. 8 through a phase difference-based auto-focusing controller. The phase difference-based auto-focusing controller detects the position of focus based on the previously stated phase difference detecting scheme. To be specific, the phase difference-based auto-focusing controller may specify where the imaging lens needs to be to properly focus an image.

According to the embodiments described above, since a plurality of shading layers including light transmitting regions that are positioned in different directions and are vertically stacked, the accuracy of a phase difference detecting pixels may be improved.

Also, since a first shading layer is disposed on the same plane as a color filter layer, the distance between the imaging lens or the micro lens and the shading mask may be shortened. Because of this, the characteristics of the phase difference-based auto-focusing may be improved.

Since the first shading layer is disposed on the same plane as the color filter layer, the amount of incident light is increased compared with structures in which both of the first shading layer and the second shading layer are formed using lining structures. Therefore, image characteristics may be improved in low illumination environments.

In addition, since the first shading layer is formed of a color filter material, the fabrication productivity of image sensors may be improved.

While the present invention has been described with respect to specific embodiments, it will be apparent to those skilled in the art that various changes and modifications may be made without departing from the spirit and scope of the invention as defined in the following claims.

What is claimed is:

1. An image sensor comprising:
a plurality of pixels arranged in two dimensions,
wherein at least one pixel among the pixels includes:
a photoelectric conversion layer formed in a substrate;
a color filter layer formed over the photoelectric conversion layer;
a first shading layer formed in the same plane as the color filter layer and defining a first light transmitting region; and
a second shading layer formed between the photoelectric conversion layer and the color filter and defining a second light transmitting region,
wherein the second shading layer is spaced apart from the color filter in a vertical direction.

2. The image sensor of claim 1, wherein the first shading layer includes a color filter material.

3. The image sensor of claim 1, wherein the first shading layer includes a black filter or an infrared ray cutoff filter.

4. The image sensor of claim 1, wherein the first shading layer includes a stacked structure having two or more stacked filters selected from a red filter, a green filter, a blue filter, a cyan filter, a magenta filter, and a yellow filter.

5. The image sensor of claim 1, wherein the first light transmitting region corresponds to the color filter layer.

6. The image sensor of claim 1, wherein the color filter layer includes one or more of a white filter, a red filter, a green filter, a blue filter, a cyan filter, a magenta filter, and a yellow filter.

7. The image sensor of claim 1, wherein the first light transmitting region and the second light transmitting region are on opposite sides, relative to a center of the photoelectric conversion layer.

8. The image sensor of claim 7, wherein an end of the first light transmitting region and an end of the second light transmitting region are aligned at the center of the photoelectric conversion layer.

9. The image sensor of claim 7, wherein a portion of the first light transmitting region overlaps with a portion of the second light transmitting region to share the center of the photoelectric conversion layer.

10. The image sensor of claim 7, wherein the first light transmitting region and the second light transmitting region are spaced apart from each other relative to the center of the photoelectric conversion layer.

11. An image sensor, comprising:
a plurality of pixels arranged in two dimensions,
wherein the pixels include at least a pair of phase difference detecting pixels that perform a pupil division on an object light in a first direction and a second direction that are different from each other and output pupil-divided images, and
each phase difference detecting pixel includes:
a photoelectric conversion layer formed in a substrate;
a color filter layer formed over the photoelectric conversion layer;
a first shading layer formed in the same plane as the color filter layer and defining a first light transmitting region; and
a second shading layer formed between the photoelectric conversion layer and the first shading layer and defining a second light transmitting region, and
the pair of the phase difference detecting pixels includes:
a first phase difference detecting pixel that has the first light transmitting region, defined by the first shading layer, disposed towards the first direction and has the second light transmitting region, defined by the second shading layer, disposed towards the second direction; and
a second phase difference detecting pixel that has the first light transmitting region, defined by the first shading layer, disposed towards the second direction and has the second light transmitting region, defined by the second shading layer, disposed towards the first direction.

12. The image sensor of claim 11, further comprising:
an inter-layer dielectric layer interposed between the substrate, on one side, and the color filter layer and the first shading layer, on an opposite side, and including the second shading layer; and
a micro lens formed over the color filter layer and the first shading layer to correspond to each pixel.

13. The image sensor of claim 11, wherein the first shading layer includes a color filter material.

14. The image sensor of claim 11, wherein the first shading layer includes a black filter or an infrared ray cutoff filter.

15. The image sensor of claim 11, wherein the first shading layer includes a stacked structure having two or more stacked filters selected from a red filter, a green filter, a blue filter, a cyan filter, a magenta filter, and a yellow filter.

16. The image sensor of claim 11, wherein the first light transmitting region corresponds to the color filter layer.

17. The image sensor of claim 11, wherein the color filter layer includes one or more of a white filter, a red filter, a green filter, a blue filter, a cyan filter, a magenta filter, and a yellow filter.

18. The image sensor of claim 11, wherein the first light transmitting regions of the pair of the phase difference detecting pixels are disposed away from each other, and the second light transmitting regions of the pair of the phase difference detecting pixels are disposed to face each other.

* * * * *